United States Patent [19]

Chuck

[11] Patent Number: 4,780,570

[45] Date of Patent: Oct. 25, 1988

[54] EMI/RFI SHIELDING FOR ELECTRONIC ASSEMBLIES

[75] Inventor: Ted Chuck, Sierra Madre, Calif.

[73] Assignee: Unisys Corporation, Detroit, Mich.

[21] Appl. No.: 31,497

[22] Filed: Mar. 30, 1987

[51] Int. Cl.$^4$ .............................................. H05K 9/00
[52] U.S. Cl. ................................ 174/35 GC; 361/424
[58] Field of Search ..................... 174/35 R, 35 GC; 364/424

[56] References Cited

U.S. PATENT DOCUMENTS 4,115,655 9/1978 Prentice ........................... 174/35 R

*Primary Examiner*—Arthur T. Grimley
*Assistant Examiner*—David A. Tone

*Attorney, Agent, or Firm*—Nathan Cass; Kevin R. Peterson; Edmund M. Chung

[57] ABSTRACT

Improved EMI/RFI shielding is provided for situations which require heavy duty wiping insertions, such as occurring when a relatively heavy electronic assembly is to be removably inserted in a cabinet. In accordance with the invention, inexpensive integral EMI/RFI strips of conductive spring material are riveted to opposite cabinet walls so as to be adjacent the wiping sides of the inserted electronic assembly. Each EMI/RFI strip contains integral longitudinally spaced projecting fingers formed to provide durable and highly reliable EMI/RFI shielding capable of withstanding many insertions and removals.

4 Claims, 2 Drawing Sheets

EMI/RFI SHIELDING FOR ELECTRONIC ASSEMBLIES

BACKGROUND OF THE INVENTION

The present invention relates to improved means and methods for providing EMI/RFI shielding for electronic devices.

It has become of considerable importance to provide EMI/RFI shielding for electronic assemblies (such as computer devices) housed in metal cabinents, particularly in view of the need to comply with FCC standards. Typically, EMI/RFI leakage occurs in the gaps which are formed between the sides of an inserted electronic assembly and the housing or walls of the cabinet. In order to eliminate these EMI/RFI leaks, it is known to provide conductive gasket-like shields in these gaps, such as are manufactured by Instrument . Specialties Company, Inc. under the trademark "Sticky Fingers" and identified in their advertising literature with U.S. Pat. No. 3,504,095. These conductive gasket-like shields are typically mounted by adhesive to the sides of an inserted assembly. However, they suffer from the disadvantage of being fragile and relatively easily damaged, particularly when used in heavy duty applications (for example, when used with a relatively heavy electronic assembly, such as a power supply).

A more durable type of shielding gasket is disclosed in U.S. Pat. No. 4,623,752.

SUMMARY OF THE INVENTION

In accordance with the present invention, a significantly improved EMI/RFI shielding gasket is provided for heavy duty wiping applications which not only is highly durable and inexpensive to provide, but which also serves as a guide to facilitate the insertion of a heavy cabinet in a manner which will not damage the EMI/RFI shielding.

In a particular preferred embodiment of the invention, an integral strip of material having spring-like characteristics (such as a flexible phosphor bronze or beryllium copper alloy with a tin finish plate for corrosion protection) is inexpensively formed into an integral EMI/RFI shielding strip having projecting longitudinally-spaced spring fingers disposed in a wiping direction and located at spaced distances dependent upon the frequencies for which EMI/RFI shielding is to be provided. These strips are used to provide EMI/RFI shielding for heavy duty wiping insertions and, accordingly, are mounted (such as by riveting) on the cabinet walls so as to be adjacent to the wiping sides of each inserted electronic assembly for which wiping EMI/RFI shielding is required. The shape, spacing, projection distance and compression provided by the integral spring fingers formed in each strip are chosen so that a highly durable and inexpensive EMI/RFI shield is achieved, wherein each spring finger makes a relatively high pressure direct contact with the adjacent cabinet housing wall, and wherein the cumulative effect of the spring fingers additionally provides a guiding action during insertion of the electronic assembly.

The specific nature of the invention as well as other objects, uses and advantages thereof will become evident from the following description of a particular preferred embodiment of the invention taken in conjunction with the accompanying drawings.

DESCRIPTION OF A PREFERRED EMBODIMENT

Like numerals refer to like elements throughout the figures of the drawings.

Figure 1:
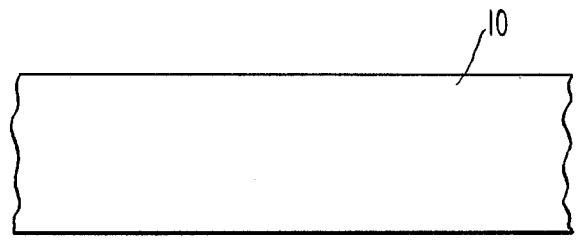
FIGS. 1-3 illustrate steps in making an EMI/RFI shielding strip in accordance with the invention.
Figure 2:
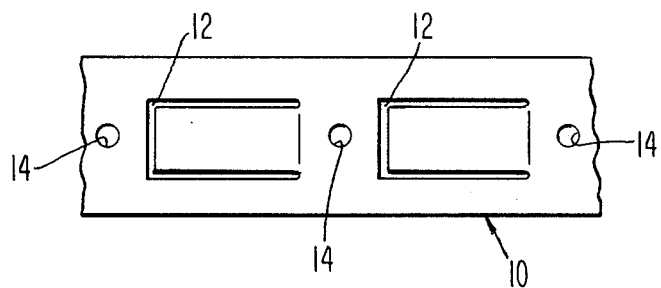
Figure 3:
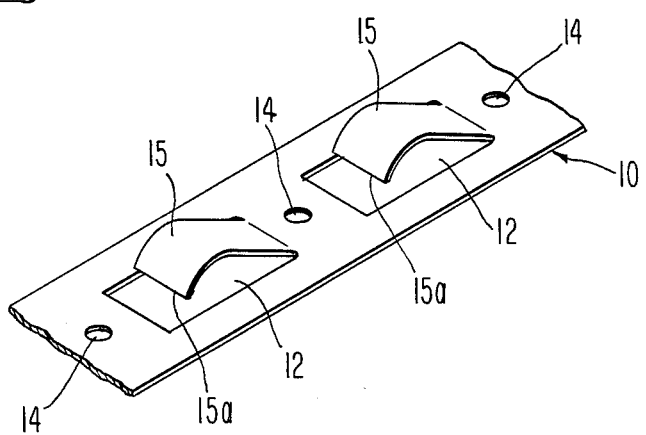

Initial reference is directed to FIGS. 1-3 which illustrate how an integral EMI/RFI shielding strip in accordance with the invention can inexpensively be provided.

FIG. 1 illustrates a section of a strip 10 of spring material, which may, for example, be 0.013 inch thick phosphor bronze Alloy, a spring material. Such strip material is commercially available and typically supplied on many-turn rolls.

Figure 4:
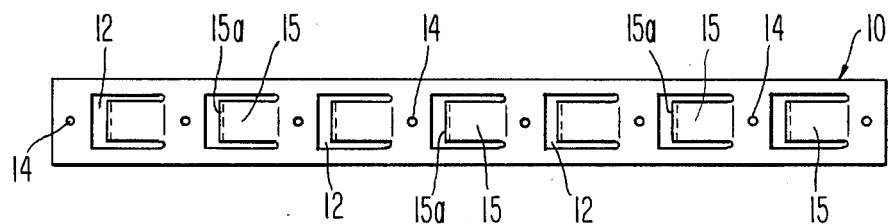
FIGS. 4 and 5 are top and side views, respectively, of a particular preferred embodiment of an EMI/RFI strip produced by the method of FIGS. 1-3.
Figure 5:
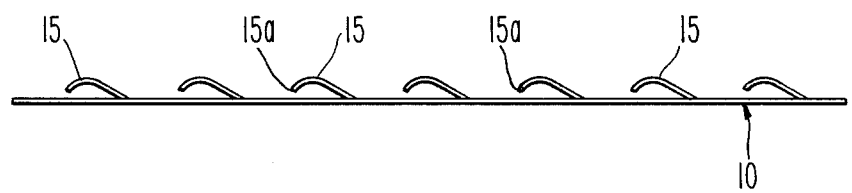

FIG. 2 illustrates an initial step in which longitudinally spaced U-shaped openings 12 and central apertures 10 are formed (such as by metal etching or stamping) along the strip 10 of FIG. 1. The FIG. 2 strip is then applied to an appropriate conventional metal forming machine (not shown) for forming spaced arcuate projecting spring fingers 15 having contact edges 15a along the strip 10, as shown in FIG. 3. FIGS. 4 and 5 are top and side views, respectively, of a particular preferred embodiment of an EMI/RFI strip produced using the steps illustrated in FIGS. 1-3

Figure 6:
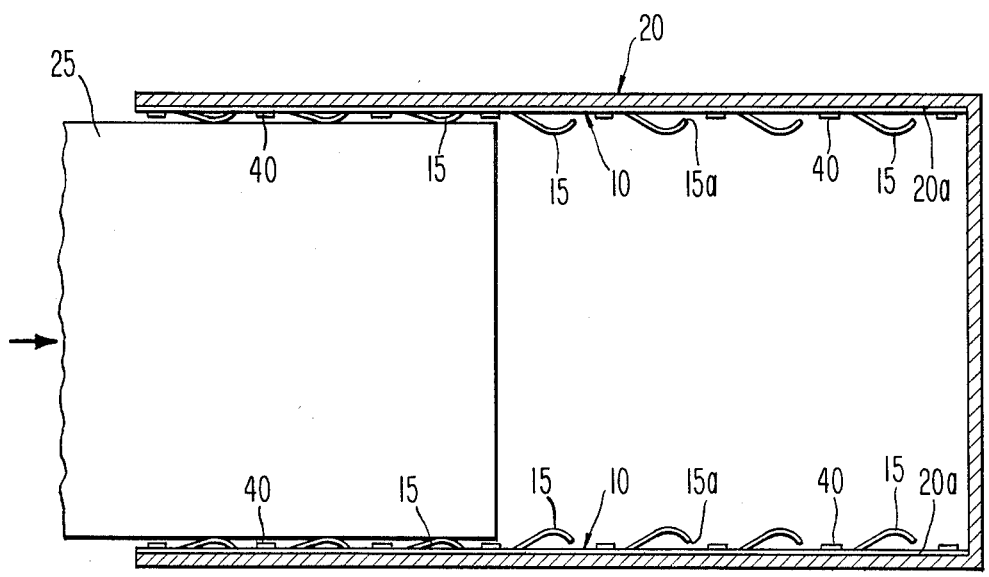
FIG. 6 illustrates a preferred manner for using the EMI/RFI strips of FIGS. 3-5 in accordance with the invention.

A preferred manner of using strips, such as shown in FIGS. 3-5, for providing EMI/RFI shielding in accordance with the invention is illustrated in FIG. 6. As shown in FIG. 6, strips 10 are mounted to opposite walls 20a of a cabinet 20 into which an electronic assembly 25, such as a power supply, is to be inserted. These strips 10 may be mounted to the cabinet walls using rivets 40 passing through the strip apertures 14. It will be understood that, if the electronic assembly 25 is to be directly adjacent top and bottom cabinet walls (not shown in FIG. 6), strips 10 would also be applied to these top and bottom cabinet walls. It will also be understood that conventional front and back end EMI/RFI shielding gaskets (not shown) may additionally be employed for providing EMI/RFI shielding at the front and back ends of the electronic assembly.

It will be appreciated from the foregoing that the use of EMI/RFI strips 10 as illustrated in FIG. 6 makes it possible to eliminate the need to mount these wiping-type EMI/RFI gaskets on the sides of the electronic assembly to be inserted, thereby eliminating concern about shield damage occurring because of their exposure when the electronic assembly is removed from the cabinet. Furthermore, since the strips 10 are firmly mounted to the cabinet walls, there is a much less likely possibility that the shield fingers 15 will be damaged during a careless insertion of the assembly. Still further, it is of significant value to use strip material of sufficient thickness to not only provide a durable spring that is not easily damaged, but also so that the cumulative effect of the spring action results in providing a guiding action during insertion of the assembly. For example, for an assembly 25 weighing 100 pounds, it has been found that the choice of a strip thickness sufficient to require a 5 pound insertion force provides a useful guiding action during insertion. Also it has been found that a strip thickness of no less than about 0.01 inch should be employed in order to reliably obtain durable spring action which will withstand many insertions and removals without damage.

It should additionally be evident that the provision of the strips 10 on the opposite cabinet walls as shown in FIG. 6 provides the advantage of permitting the use of simpler spring fingers 15 which need be compressively wiped in only one direction, that is, in the insertion direction. More specifically, it will be understood that the spring fingers 15 will compress during insertion, causing the contact edge 15*a* of each compressed spring finger to pass through the strip opening 12 (as best shown in FIG. 3) to make a reliable direct high pressure contact with the cabinet wall. Upon removal, the compression produced during insertion is removed from the spring fingers 15, leaving them in their original uncompressed state.

Although the invention has been described in connection with a particular preferred embodiment, it is to be understood that various modifications in construction, arrangement and use are possible without departing from the true scope of applicant's invention. Accordingly, the present invention is to be considered as encompassing all modifications and variations coming within the scope of the appended claims.

What is claimed is:

1. A cabinet providing improved EMI/RFI shielding and guiding action for a relatively heavy electronic assembly of generally rectangular shape to be removably insertable in said cabinet, said cabinet having first and second spaced conductive parallel walls located so as to be adjacent and parallel to the side walls of the electronic assembly to be inserted;

an integral EMI strip of spring material rigidly affixed to each of said walls;

each strip having longitudinally spaced openings and a plurality of integral longitudinally spaced longitudinally projecting spring fingers depending perpendicularly from like sides of respective ones of said openings such that said spring fingers project perpendicularly outward from the respective cabinet wall to which the strip is affixed;

each spring finger having a size, shape and location chosen so that the wiping action of an inserted electronic assembly will produce a compressive longitudinal wiping force which is applied to said projecting spring fingers in a direction toward the free end edge of the fingers causing the free end thereof to be driven into their respective openings so as to make direct high pressure electrical contacts with the adjacent cabinet wall;

said strips further being chosen such that said spring fingers provide an insertion force during insertion of the electronic assembly which provides a guiding action therefor.

2. The invention in accordance with claim 1, wherein the thickness of said strip is not less than 0.01 inch.

3. The invention in accordance with claim 2, wherein said insertion force is at least five pounds.

4. The invention in accordance with claim 1, wherein each strip contains a corrosion resistant conductive coating.

* * * * *